(12) United States Patent
Choi

(10) Patent No.: US 11,474,740 B2
(45) Date of Patent: Oct. 18, 2022

(54) MEMORY SYSTEM AND MEMORY CONTROLLER

(71) Applicant: SK hynix Inc., Gyeonggi-do (KR)

(72) Inventor: Woo Sick Choi, Seoul (KR)

(73) Assignee: SK hynix Inc., Gyeonggi-do (KR)

( * ) Notice: Subject to any disclaimer, the term of this patent is extended or adjusted under 35 U.S.C. 154(b) by 8 days.

(21) Appl. No.: 16/884,631

(22) Filed: May 27, 2020

(65) Prior Publication Data

US 2021/0191654 A1 Jun. 24, 2021

(30) Foreign Application Priority Data

Dec. 20, 2019 (KR) .......................... 10-2019-0171464

(51) Int. Cl.
*G06F 3/06* (2006.01)
*G06F 13/16* (2006.01)

(52) U.S. Cl.
CPC .......... *G06F 3/0659* (2013.01); *G06F 3/0604* (2013.01); *G06F 3/0673* (2013.01); *G06F 13/1668* (2013.01)

(58) Field of Classification Search
CPC ... G06F 3/0659; G06F 3/0604; G06F 13/1668
See application file for complete search history.

(56) References Cited

U.S. PATENT DOCUMENTS

2014/0312930 A1\* 10/2014 Lee .......................... H03K 5/00
326/37
2019/0121696 A1\* 4/2019 Chen ................... G06F 12/0607

FOREIGN PATENT DOCUMENTS

KR 10-2014-0017034 2/2014

\* cited by examiner

*Primary Examiner* — Gary W. Cygiel
(74) *Attorney, Agent, or Firm* — IP & T Group LLP

(57) ABSTRACT

Embodiments of the present disclosure relate to a memory system and a memory controller, in which data input/output terminals in different data input/output terminal groups corresponding to different channels may be arranged adjacent to each other, thereby preventing skew of a signal occurring during data input/output operations and interference between different signals and reducing the cost required for implementing the memory system.

9 Claims, 14 Drawing Sheets

MEMORY SYSTEM AND MEMORY CONTROLLER

CROSS REFERENCE TO RELATED APPLICATION

The present application claims priority under 35 U.S.C. 119(a) to Korean patent application number 10-2019-0171464, filed on Dec. 20, 2019, which is incorporated herein by reference in its entirety.

BACKGROUND

1. Field of the Invention

Embodiments of the present disclosure relate to a memory system and a memory controller.

2. Description of the Prior Art

A memory system, e.g., a storage device, stores data on the basis of a request from a host, such as a computer, a mobile terminal (for example, a smartphone or a tablet), or any of various other electronic devices. The memory system may be a device configured to store data in a magnetic disk such as a hard disk drive (HDD), or a device configured to store data in a nonvolatile memory such as a solid state drive (SSD), a universal flash storage device (UFS), or an embedded MMC (eMMC) device.

The memory system may further include a memory controller for controlling the memory device. The memory controller may receive a command input from the host and on the basis of the received command, may execute or control operations for reading, writing, or erasing data in a volatile memory or a nonvolatile memory included in the memory system. The memory controller may drive firmware for performing a logical operation for executing or controlling such operations.

When the memory system reads or writes data at high speed, skew may occur in a signal transmitted through a signal line connected to a terminal through which data is input/output in the memory system. In addition, there is a possibility that interference between signals transmitted through different signal lines occurs.

SUMMARY

Embodiments of the present disclosure may provide a memory system and a memory controller which can prevent skew of a signal occurring during data input/output operations and interference between different signals.

In one aspect, embodiments of the present disclosure may provide a memory system including a plurality of memory dies and a memory controller that controls the plurality of memory dies.

The memory controller may include a physical interface circuit including a plurality of data input/output terminals. The data input/output terminal is a path through which data for N channels (N is a natural number of two or more) is input/output.

K data input/output terminals (K is a natural number of two or more) in a first data input/output terminal group among the plurality of data input/output terminals may correspond to a first channel of the N channels.

K data input/output terminals in a second data input/output terminal group among the plurality of data input/output terminals may correspond to a second channel of the N channels.

The data input/output terminal in the first data input/output terminal group may be arranged adjacent to one or more of the data input/output terminals in the second data input/output terminal group.

Each data input/output terminal is connected to one of a plurality of package terminals connected to one or more of the plurality of memory dies.

A first package terminal among the package terminals corresponding to a L-th bit of the first channel (L is an integer greater than or equal to 0) is arranged adjacent to a second package terminals among the package terminals corresponding to a L-th bit of the second channel.

For example, the data input/output terminal corresponding to data of an I-th bit among the K data input/output terminals in the first data input/output terminal group, and the data input/output terminal corresponding to data of an I-th bit among the K data input/output terminals in the second data input/output terminal group may be arranged adjacent to each other.

In another aspect, embodiments of the present disclosure may provide a memory controller including a plurality of memory dies and a control circuit for controlling the plurality of memory dies.

The control circuit may include a physical interface circuit including a plurality of data input/output terminals. The data input/output terminal is a path through which data for N channels (N is a natural number of two or more) is input/output.

K data input/output terminals (K is a natural number of two or more) in a first data input/output terminal group among the plurality of data input/output terminals may correspond to a first channel of the N channels.

K data input/output terminals in a second data input/output terminal group among the plurality of data input/output terminals may correspond to a second channel of the N channels.

The data input/output terminal in the first data input/output terminal group may be arranged adjacent to one or more of the data input/output terminals included in the second data input/output terminal group.

Each data input/output terminal is connected to one of a plurality of package terminals connected to one or more of the plurality of memory dies.

A first package terminal among the package terminals corresponding to a L-th bit of the first channel (L is an integer greater than or equal to 0) is arranged adjacent to a second package terminals among the package terminals corresponding to a L-th bit of the second channel.

For example, the data input/output terminal corresponding to data of an I-th bit among the K data input/output terminals in the first data input/output terminal group, and the data input/output terminal corresponding to data of an I-th bit among the K data input/output terminals in the second data input/output terminal group may be arranged adjacent to each other.

In another aspect, embodiments of the present disclosure may provide a system including master and slave circuits each including N groups each having K terminals.

The master and slave circuits communicate with each other through the terminals transferring signals of N channels each having a bandwidth of K bits. The N groups respectively correspond to the N channels. The K terminals respectively correspond to the K bits.

The K terminals within each of the N groups are sequentially disposed at each of the master and slave circuits.

The K terminals of the same sequence within the respective N groups are alternately disposed at each of the master and slave circuits.

In another aspect, embodiments of the present disclosure may provide a system including master and slave circuits each including N groups each having K terminals.

The master and slave circuits communicate with each other through the terminals transferring signals of N channels each having a bandwidth of K bits. The N groups respectively correspond to the N channels. The K terminals respectively correspond to the K bits.

Arrangements of the terminals within the respective master and slave circuits are the same as each other.

According to embodiments of the present disclosure, it is possible to prevent skew of a signal occurring during data input/output operation and interference between different signals.

In addition, according to embodiments of the present disclosure, it is possible to reduce the cost of implementing a memory system.

BRIEF DESCRIPTION OF THE DRAWINGS

The above and other aspects, features and advantages of the present disclosure will be more apparent from the following detailed description taken in conjunction with the accompanying drawings.

DETAILED DESCRIPTION

Hereinafter, embodiments of the present disclosure are described in detail with reference to the accompanying drawings. Throughout the specification, reference to "an embodiment," "another embodiment" or the like is not necessarily to only one embodiment, and different references to any such phrase are not necessarily to the same embodiment(s).

Figure 1:
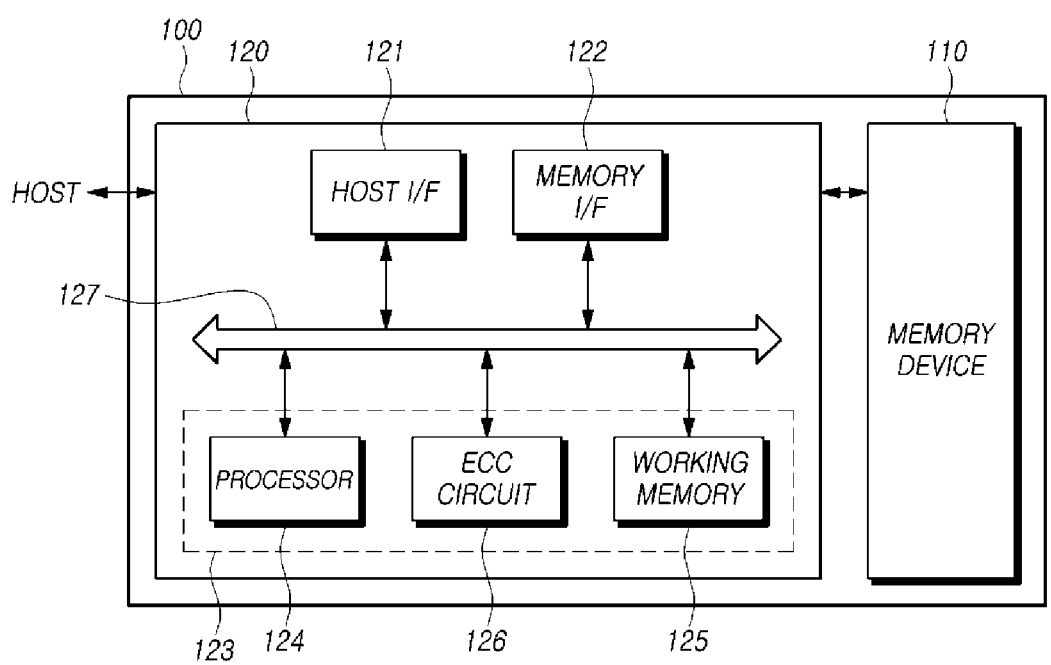
FIG. 1 is a schematic diagram illustrating a configuration of a memory system according to an embodiment of the present disclosure.

FIG. 1 is a schematic diagram illustrating a configuration of a memory system 100 according to an embodiment of the present disclosure.

Referring to FIG. 1, the memory system 100 may include a memory device 110 configured to store data, and a memory controller 120 configured to control the memory device 110.

The memory device 110 may include multiple memory blocks. The memory device 110 may be configured to operate in response to control signals received from the memory controller 120. Operations of the memory device 110 may include, for example, a read operation, a program operation (also referred to as a "write operation"), an erasure operation, and the like.

The memory device 110 may include a memory cell array including multiple memory cells (also simply referred to as "cells") configured to store data. The memory cell array may exist inside a memory block.

For example, the memory device 110 may be implemented as any of various types of memories, such as a double data rate synchronous dynamic random access memory (DDR SDRAM), a low power double data rate4 (LPDDR4) SDRAM, a graphics double data rate (GDDR) SDRAM, a low power DDR (LPDDR), a rambus dynamic random access memory (RDRAM), a NAND flash memory, a vertical NAND flash memory, a NOR flash memory, a resistive random access memory (RRAM), a phase-change memory (PRAM), a magnetoresistive random access memory (MRAM), a ferroelectric random access memory (FRAM), or a spin transfer torque random access memory (STT-RAM).

The memory device 110 may be implemented in a three-dimensional array structure. Embodiments of the present disclosure are applicable not only to a flash memory device having an electric charge storage layer configured as a conductive floating gate, but also to a flash memory device having a charge trap flash (CTF) having an electric charge storage layer configured as an insulating film.

The memory device 110 may be configured to receive a command and an address from the memory controller 120 and to access an area of the memory cell array, which is selected by the address. That is, the memory device 110 may perform an operation corresponding to the received command in a memory area of the memory device having a physical address corresponding to the received address from the controller.

For example, the memory device 110 may perform a program operation, a read operation, an erasure operation, and the like. In relation thereto, during the program operation, the memory device 110 may program data in the area selected by the address. During the read operation, the memory device 110 may read data from the area selected by the address. During the erasure operation, the memory device 110 may erase data stored in the area selected by the address.

The memory controller 120 may control write (program), read, erasure, and background operations with regard to the memory device 110. The background operation may include, for example, at least one among a garbage collection operation (GC), a wear leveling (WL) operation, and a bad block management (BBM) operation.

The memory controller 120 may control the operation of the memory device 110 at the request of a host. Alternatively, the memory controller 120 may control the operation of the memory device 110 without a corresponding request of the host, such as, for example, when the memory controller 120 directs the memory device 110 to perform one or more background operations.

The memory controller 120 and the host may be separate devices. In another embodiment, the memory controller 120 and the host may be integrated and implemented as a single device. In the following description, the memory controller 120 and the host are separate devices.

Referring to FIG. 1, the memory controller 120 may include a memory interface 122, a control circuit 123, and a host interface 121.

The host interface 121 may be configured to provide an interface for communication with the host.

When receiving a command from the host (HOST), the control circuit 123 may receive the command through the host interface 121 and may perform an operation of processing the received command.

The memory interface 122 may be connected to the memory device 110 to provide an interface for communication with the memory device 110. That is, the memory interface 122 may be configured to provide the memory device 110 and the memory controller 120 with an interface in response to a control of the control circuit 123.

The control circuit 123 may be configured to control the operation of the memory device 110 by performing operations for overall control of the memory controller 120. For example, the control circuit 123 may include a processor 124 and a working memory 125. The control circuit 123 may further include an error detection/correction circuit (ECC circuit) 126 and the like.

The processor 124 may control the overall operation of the memory controller 120. The processor 124 may perform a logical operation. The processor 124 may communicate with the host through the host interface 121. The processor 124 may communicate with the memory device 110 through the memory interface 122.

The processor 124 may perform a function of a flash translation layer (FTL). The processor 124 may translate a logical block address (LBA) provided by the host into a physical block address (PBA) through the FTL. The FTL may receive the LBA and translate the LBA into the PBA by using a mapping table.

There are various address mapping methods which may be employed by the FTL, according to the mapping unit. Typical address mapping methods include a page mapping method, a block mapping method, and a hybrid mapping method.

The processor 124 may be configured to randomize data received from the host. For example, the processor 124 may randomize data received from the host by using a randomizing seed. The randomized data is provided to the memory device 110 as data to be stored, and is programmed in the memory cell array.

The processor 124 may be configured to derandomize data received from the memory device 110 during a read operation. For example, the processor 124 may derandomize data received from the memory device 110 by using a derandomizing seed. The derandomized data may be output to the host.

The processor 124 may execute firmware (FW) so as to control the operation of the memory controller 120. In other words, the processor 124 may control the overall operation of the memory controller 120 and, in order to perform a logical operation, may execute (drive) firmware loaded into the working memory 125 during booting.

The firmware refers to a program executed inside the memory system 100, and may include various functional layers.

For example, the firmware may include a flash translation layer (FTL) configured to translate between a logical address that the host requests the memory system 100 to provide and a physical address of the memory device 110, a host interface layer (HIL) configured to interpret a command that the host issues to the memory system 100 (storage device) and to deliver the same to the FTL, and/or a flash interface layer (FIL) configured to deliver a command issued by the FTL to the memory device 110.

For example, the firmware may be stored in the memory device 110, then loaded into the working memory 125.

The working memory 125 may store firmware, program codes, commands, or pieces of data to drive the memory controller 120. The working memory 125 may be a volatile memory, for example, a static RAM (SRAM), a dynamic RAM (DRAM), or a synchronous RAM (SDRAM).

The error detection/correction circuit 126 may be configured to detect an error bit of target data by using an error correction code, and to correct the detected error bit. For example, the target data may be data stored in the working memory 125, data retrieved from the memory device 110, or the like.

The error detection/correction circuit 126 may be implemented to decode data by using the error correction code. The error detection/correction circuit 126 may be implemented by using various code decoders. For example, a decoder that performs nonsystematic code decoding or a decoder that performs systematic code decoding may be used.

For example, the error detection/correction circuit 126 may detect an error bit, sector by sector, with regard to each piece of read data. That is, each piece of read data may include multiple sectors. As used herein, a sector may refer to a data unit smaller than the read unit (page) of a flash memory. Sectors constituting each piece of read data may correspond to each other via an address.

The error detection/correction circuit 126 may calculate a bit error rate (BER) and determine whether or not correction can be made sector by sector. For example, if the BER is higher than a reference value, the error detection/correction circuit 126 may determine that the corresponding sector is uncorrectable or "a fail". If the BER is lower than the reference value, the error detection/correction circuit 126 may determine that the corresponding sector is correctable or "a pass".

The error detection/correction circuit 126 may perform error detection and correction operations successively with regard to all pieces of read data. When a sector included in the read data is correctable, the error detection/correction circuit 126 may omit the error detection and correction operations related to the corresponding sector with regard to the next piece of read data. After finishing error detection and correction operations with regard to all pieces of read data in this manner, the error detection/correction circuit 126 may detect one or more sectors deemed uncorrectable in the read data. The error detection/correction circuit 126 may deliver information (for example, address information) regarding the sector(s) deemed uncorrectable to the processor 124.

The bus 127 may be configured to provide a channel between the constituent elements 121, 122, 124, 125, and 126 of the memory controller 120. The bus 127 may include, for example, a control bus for delivering various kinds of control signals and commands, and a data bus for delivering various kinds of data.

The above-mentioned constituent elements 121, 122, 124, 125, and 126 of the memory controller 120 are only provided as examples. One or more of these elements may be omitted, or two or more may be integrated into a single element. Of course, as those skilled in the art will understand, the memory controller 120 may include more components than those illustrated in FIG. 1.

Hereinafter, the memory device 110 is described in more detail with reference to FIG. 2.

Figure 2:
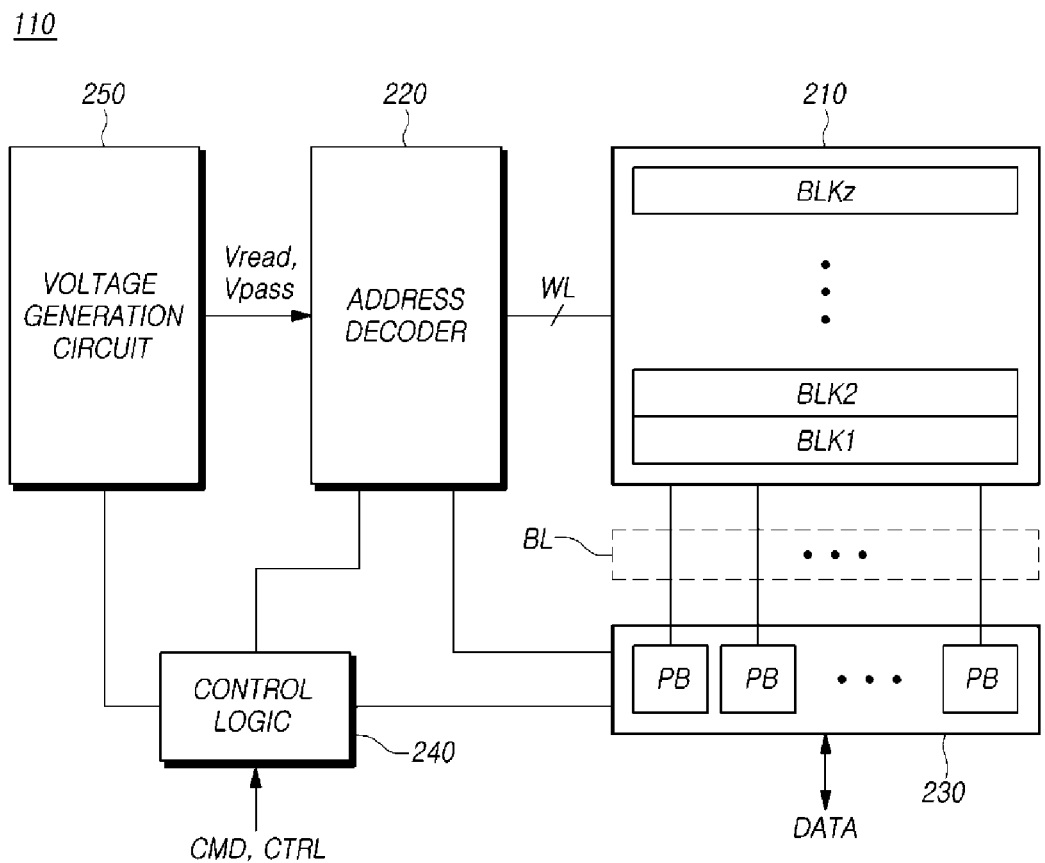
FIG. 2 is a block diagram schematically illustrating a memory device according to an embodiment of the present disclosure.

FIG. 2 is a block diagram schematically illustrating a memory device 110 according to an embodiment of the present disclosure.

Referring to FIG. 2, the memory device 110 may include a memory cell array 210, an address decoder 220, a read/write circuit 230, control logic 240, and a voltage generation circuit 250.

The memory cell array 210 may include multiple memory blocks BLK1-BLKz (z is a natural number equal to or larger than 2).

In the multiple memory blocks BLK1-BLKz, multiple word lines WL and multiple bit lines BL may be disposed in an intersecting arrangement, and multiple memory cells MC may be formed at the respective intersections.

The multiple memory blocks BLK1-BLKz may be connected to the address decoder 220 through the multiple word lines WL. The multiple memory blocks BLK1-BLKz may be connected to the read/write circuit 230 through the multiple bit lines BL.

Each of the multiple memory blocks BLK1-BLKz may include multiple memory cells. For example, the multiple memory cells are nonvolatile memory cells, which may have a vertical channel structure.

The memory cell array 210 may be configured as a memory cell array having a two-dimensional structure and, in some cases, may be configured as a memory cell array having a three-dimensional structure.

Each of the multiple memory cells in the memory cell array 210 may store at least one bit of data. For example, each of the multiple memory cells in the memory cell array 210 may be a single-level cell (SLC) configured to store one bit of data, a multi-level cell (MLC) configured to store two bits of data, or a triple-level cell (TLC) configured to store three bits of data. Higher storage capacity memory cells may also be used. To that end, each of the multiple memory cells in the memory cell array 210 may be a quad-level cell (QLC) configured to store four bits of data or a memory cell configured to store at least five bits of data.

Referring to FIG. 2, the address decoder 220, the read/write circuit 230, the control logic 240, and the voltage generation circuit 250 may collectively operate as a peripheral circuit configured to drive the memory cell array 210.

The address decoder 220 may be connected to the memory cell array 210 through the multiple word lines WL.

The address decoder 220 may be configured to operate in response to a control of the control logic 240.

The address decoder 220 may receive addresses through an input/output buffer inside the memory device 110. The address decoder 220 may be configured to decode a block address among the received addresses. The address decoder 220 may select at least one memory block according to the decoded block address.

The address decoder 220 may receive a read voltage Vread and a pass voltage Vpass from the voltage generation circuit 250.

The address decoder 250 may apply the read voltage Vread to a selected word line WL inside a selected memory block, during an operation of applying the read voltage during a read operation, and may apply the pass voltage Vpass to the remaining non-selected word lines WL.

The address decoder 220 may apply a verification voltage generated by the voltage generation circuit 250 to a selected word line WL inside a selected memory block, during a program verification operation, and may apply the pass voltage Vpass to the remaining non-selected word lines WL.

The address decoder 220 may be configured to decode a column address among the received addresses. The address decoder 220 may transmit the decoded column address to the read/write circuit 230.

The memory device 110 may perform the read operation and the program operation page by page. Addresses received when the read operation and the program operation are requested may include at least one of a block address, a row address, and a column address.

The address decoder 220 may select one memory block and one word line according to the block address and the row address. The column address may be decoded by the address decoder 220 and provided to the read/write circuit 230.

The address decoder 220 may include at least one of a block decoder, a row decoder, a column decoder, and an address buffer.

The read/write circuit 230 may include multiple page buffers PB. The read/write circuit 230 may operate as a "read circuit" when the memory cell array 210 performs a read operation, and may operate as a "write circuit" when the memory cell array 210 performs a write operation.

The above-mentioned read/write circuit 230 is also referred to as a page buffer circuit including multiple page buffers PB, or a data register circuit. The read/write circuit 230 may include a data buffer that participates in a data processing function and, in some cases, may further include a cache buffer in charge of a caching function.

The multiple page buffers PB may be connected to the memory cell array 210 through the multiple bit lines BL. In order to sense the threshold voltage Vth of the memory cells during a read operation and a program verification operation, the multiple page buffers PB may continuously supply a sensing current to the bit lines BL connected to the memory cells, may sense, through a sensing node, a change in the amount of current that flows according to the program state of a corresponding memory cell, and may latch the same as sensing data.

The read/write circuit 230 may operate in response to page buffer control signals output from the control logic 240.

During a read operation, the read/write circuit 230 senses data in a memory cell, temporarily stores the retrieved data, and outputs the data DATA to the input/output buffer of the memory device 110. In an embodiment, the read/write circuit 230 may include a column selection circuit, in addition to the page buffers PB or page registers.

The control logic 240 may be connected to the address decoder 220, the read/write circuit 230, and the voltage generation circuit 250. The control logic 240 may receive a command CMD and a control signal CTRL through the input/output buffer of the memory device 110.

The control logic 240 may be configured to control the overall operation of the memory device 110 in response to the control signal CTRL. The control logic 240 may output a control signal for adjusting the pre-charge potential level of sensing nodes of multiple page buffers PB.

The control logic 240 may control the read/write circuit 230 to perform a read operation in the memory cell array 210. The voltage generation circuit 250 may generate a read voltage Vread and a pass voltage Vpass, which are used during the read operation, in response to a voltage generation circuit control signal output from the control logic 240.

Figure 3:
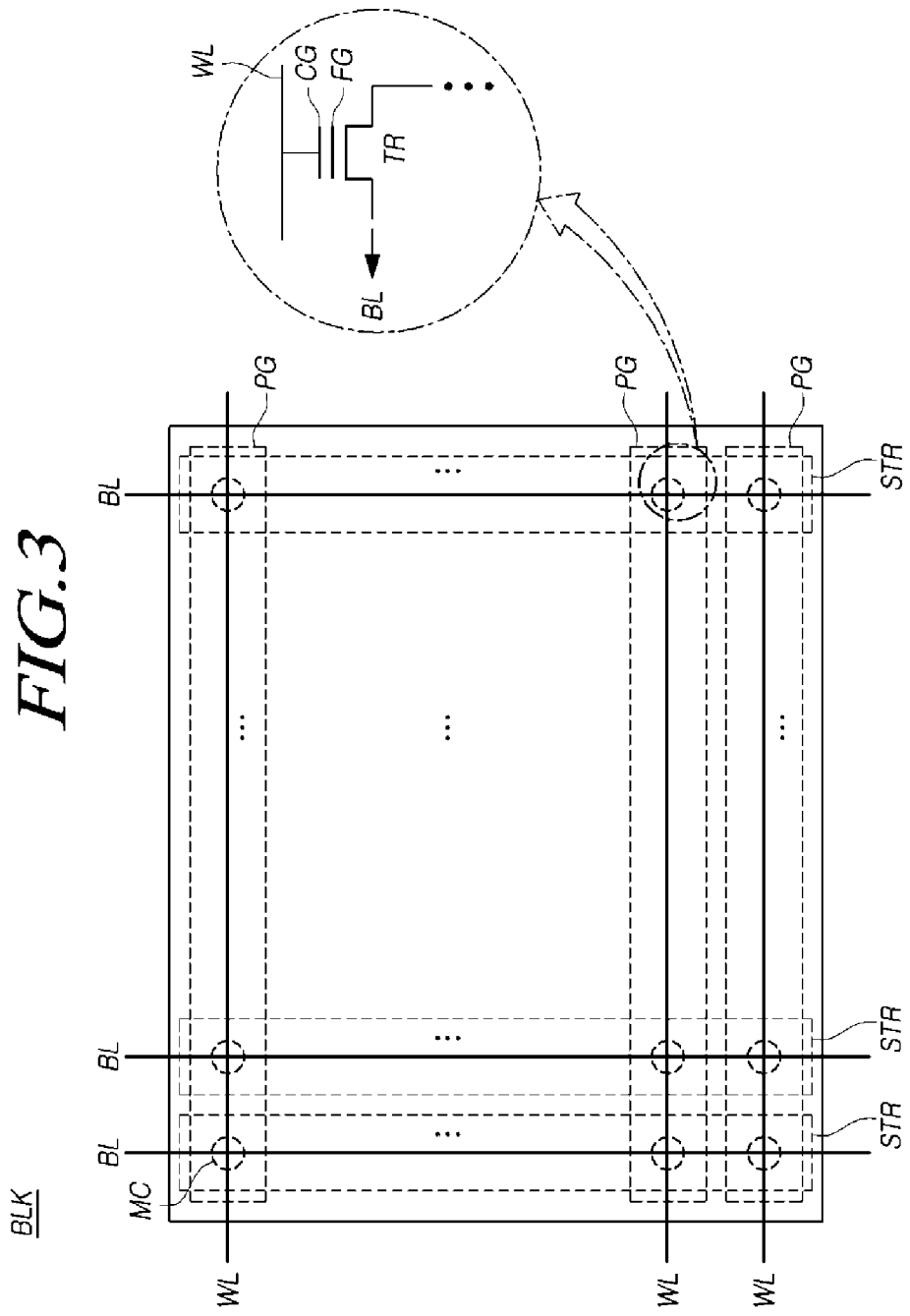
FIG. 3 is a diagram schematically illustrating a memory block of a memory device according to an embodiment of the present disclosure.

FIG. 3 is a diagram schematically illustrating a memory block BLK of a memory device 110 according to an embodiment of the present disclosure.

Referring to FIG. 3, a memory block BLK included in the memory device 110 may be arranged and configured in such direction that multiple pages PG and multiple strings TTR intersect.

The multiple pages PG correspond to multiple word lines WL, and the multiple strings STR correspond to multiple bit lines BL.

In the memory block BLK, multiple word lines WL and multiple bit lines BL may be arranged to intersect. For example, each of the multiple word lines WL may be arranged in the row direction, and each of the multiple bit lines BL may be arranged in the column direction. As another example, each of the multiple word lines WL may be arranged in the column direction, and each of the multiple bit lines BL may be arranged in the row direction.

The multiple word lines WL and the multiple bit lines BL may intersect with each other, thereby defining multiple memory cells MC. Each memory cell MC may have a transistor TR arranged therein.

For example, the transistor TR arranged in each memory cell MC may include a drain, a source, and a gate. The drain (or source) of the transistor TR may be connected to the corresponding bit line BL directly or via another transistor TR. The source (or drain) of the transistor TR may be connected to the source line (which may be the ground) directly or via another transistor TR. The gate of the transistor TR may include a floating gate (FG) surrounded by an insulator, and a control gate (CG) to which a gate voltage is applied from a word line WL.

In each of the multiple memory blocks BLK1-BLKz, a first selection line (also referred to as a source selection line or a drain selection line) may be additionally arranged outside the first outermost word line, which is closer to the read/write circuit 230 among two outermost word lines, and a second selection line (also referred to as a drain selection line or a source selection line) may be additionally arranged outside the other second outermost word line.

In some cases, at least one dummy word line may be additionally arranged between the first outermost word line and the first selection line. In addition, at least one dummy word line may be additionally arranged between the second outermost word line and the second selection line.

In the case of a memory block structure as illustrated in FIG. 3, a read operation and a program operation (write operation) may be performed page by page, and an erasure operation may be performed memory block by memory block.

Figure 4:
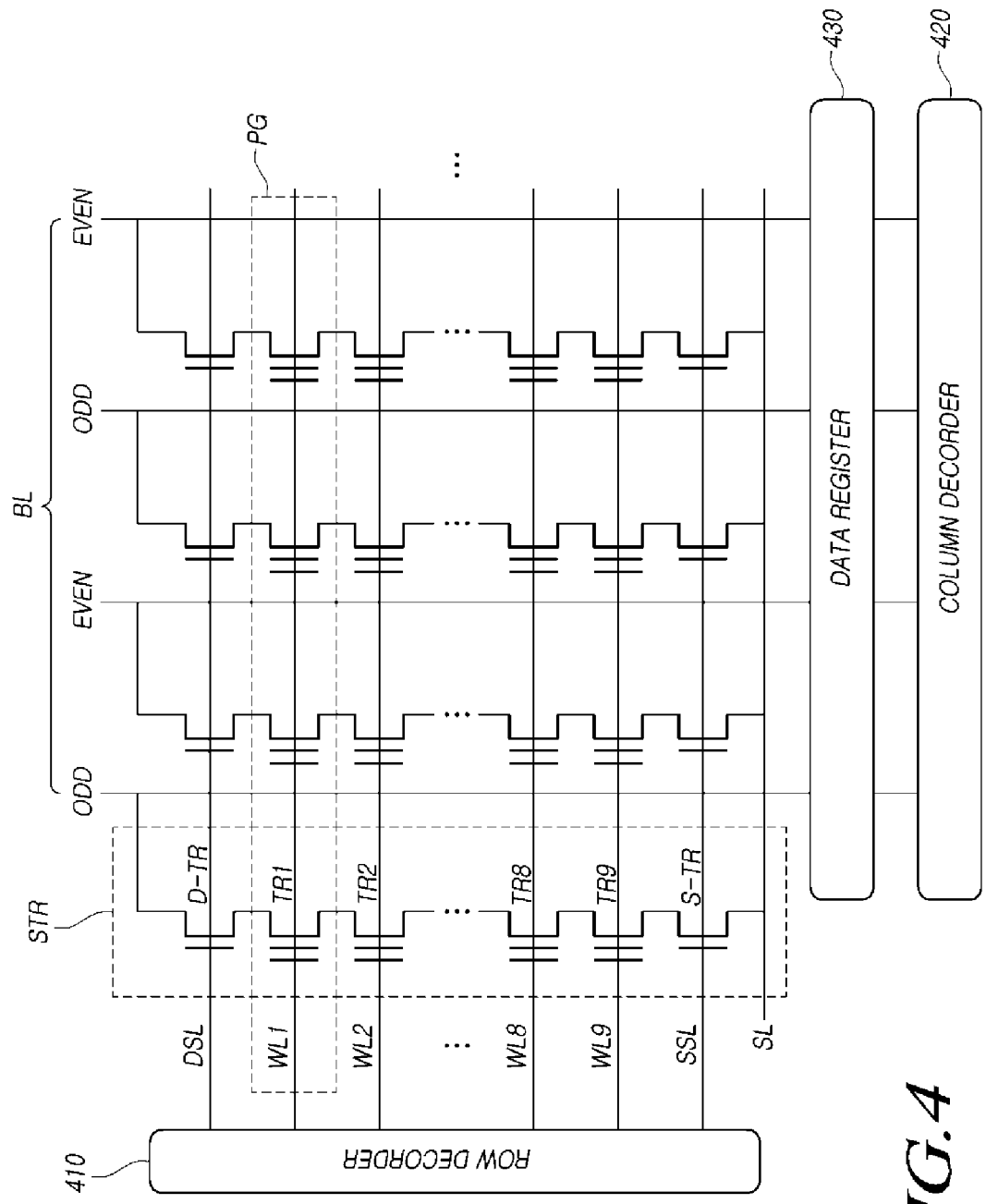
FIG. 4 is a diagram illustrating the structure of word lines and bit lines of a memory device according to an embodiment of the present disclosure.

FIG. 4 is a diagram illustrating a structure of word lines WL and bit lines BL of a memory device 110 according to an embodiment of the present disclosure.

Referring to FIG. 4, the memory device 110 has a core area in which memory cells MC are concentrated, and an auxiliary area which corresponds to the remaining (i.e., non-core) area. The auxiliary area supports the operations of the memory cell array 210.

The core area may include pages PG and strings STR. In the core area, multiple word lines WL1-WL9 and multiple bit lines BL are arranged to intersect.

The word lines WL1-WL9 may be connected to a row decoder 410. The bit lines BL may be connected to a column decoder 420. A data register 430, which corresponds to the read/write circuit 230 of FIG. 2, may exist between the multiple bit lines BL and the column decoder 420.

The multiple word lines WL1-WL9 may correspond to multiple pages PG.

For example, each of the multiple word lines WL1-WL9 may correspond to one page PG as illustrated in FIG. 4. In contrast, when each of the multiple word lines WL1-WL9 has a large size, each of the multiple word lines WL1-WL9 may correspond to at least two (for example, two or four) pages PG. Each page PG is the smallest unit in connection with conducting a program operation and a read operation, and all memory cells MC within the same page PG may perform simultaneous operations when conducting a program operation and a read operation.

The multiple bit lines BL may be connected to the column decoder 420 while being distinguished between odd-numbered bit lines BL and even-numbered bit lines BL.

For accessing a memory cell MC, the address may be entered to the core area first through the input/output end and then through the row decoder 410 and the column decoder 420 such that a corresponding target memory cell can be designated. As used herein, designating a target memory cell refers to accessing one of the memory cells MC at the sites of intersection between the word lines WL1-WL9 connected to the row decoder 410 and the bit lines BL connected to the column decoder 420, for programming data therein or for reading programmed data therefrom.

Pages PG in a first direction (for example, X-axis direction) are bound by a commonly used line referred to as a word line WL, and strings STR in a second direction (for example, Y-axis direction) are bound (connected) by a common line referred to as a bit line BL. As used herein, being commonly bound refers to being structurally connected by the same material and simultaneously receiving the same voltage during voltage application. The voltage applied to a memory cell MC in positions among memory cells MC connected in series may differ slightly, due to the voltage drop across the preceding memory cell MC.

The data register 430 plays an integral role because all data processing by the memory device 110, including program and read operations, occurs via the data register 430. If data processing by the data register 430 is delayed, all the other areas need to wait until the data register 430 finishes the data processing. In addition, degradation of performance of the data register 430 may degrade the overall performance of the memory device 110.

Referring to the example illustrated in FIG. 4, in one string STR, multiple transistors TR1-TR9 connected to multiple word lines WL1-WL9 may exist. The areas in which the multiple transistor TR1-TR9 exist correspond to memory cells MC. As used herein, the multiple transistors TR1-TR9 refer to transistors including control gates CG and floating gates FG.

The multiple word lines WL1-WL9 include two outermost word lines WL1 and WL9. A first selection line DSL may be additionally arranged outside the first outermost word line WL1, which is closer to the data register 430 in terms of the signal path among the two outermost word lines WL1 and WL9, and a second selection line SSL may be additionally arranged outside the other second outermost word line WL9.

The first selection transistor D-TR, which is controlled to turn on/off by the first selection line DSL, has a gate electrode connected to the first selection line DSL, but includes no floating gate FG. The second selection transistor S-TR, which is controlled to turn on/off by the second selection line SSL, has a gate electrode connected to the second selection line SSL, but includes no floating gate FG.

The first selection transistor D-TR plays the role of a switch that turns on or off the connection between the corresponding string STR and the data register 430. The second selection transistor S-TR plays the role of a switch that turns on or off the connection between the corresponding string STR and the source line SL. That is, the first selection transistor D-TR and the second selection transistor S-TR play the role of gatekeepers which are positioned on both ends of the corresponding string STR and deliver/block signals.

The memory system 100 needs to fill the target memory cell MC of the bit line BL to be programmed with electrons during a program operation. Accordingly, the memory system 100 applies a turn-on voltage Vcc to the gate electrode of the first selection transistor D-TR, thereby turning on the first selection transistor D-TR, and applies a turn-off voltage (for example, 0V) to the gate electrode of the second selection transistor S-TR, thereby turning off the second selection transistor S-TR.

The memory system 100 turns on both the first selection transistor D-TR and the second selection transistor S-TR during a read operation or a verification operation. Accordingly, an electric current may flow through the corresponding string STR and drain to the source line SL, which corresponds to the ground, such that the voltage level of the bit line BL can be measured. However, during a read operation, there may be a time difference in on/off timing between the first selection transistor D-TR and the second selection transistor S-TR.

The memory system 100 may supply a voltage (for example, +20V) to the substrate through a source line SL during an erasure operation. The memory system 100 floats both the first selection transistor D-TR and the second selection transistor S-TR during an erasure operation, thereby generating an infinite resistance. As a result, the role of the first selection transistor D-TR and that of the second selection transistor S-TR may be removed, and electrons may operate only between the floating gate FG and the substrate due to the potential difference.

Figure 5:
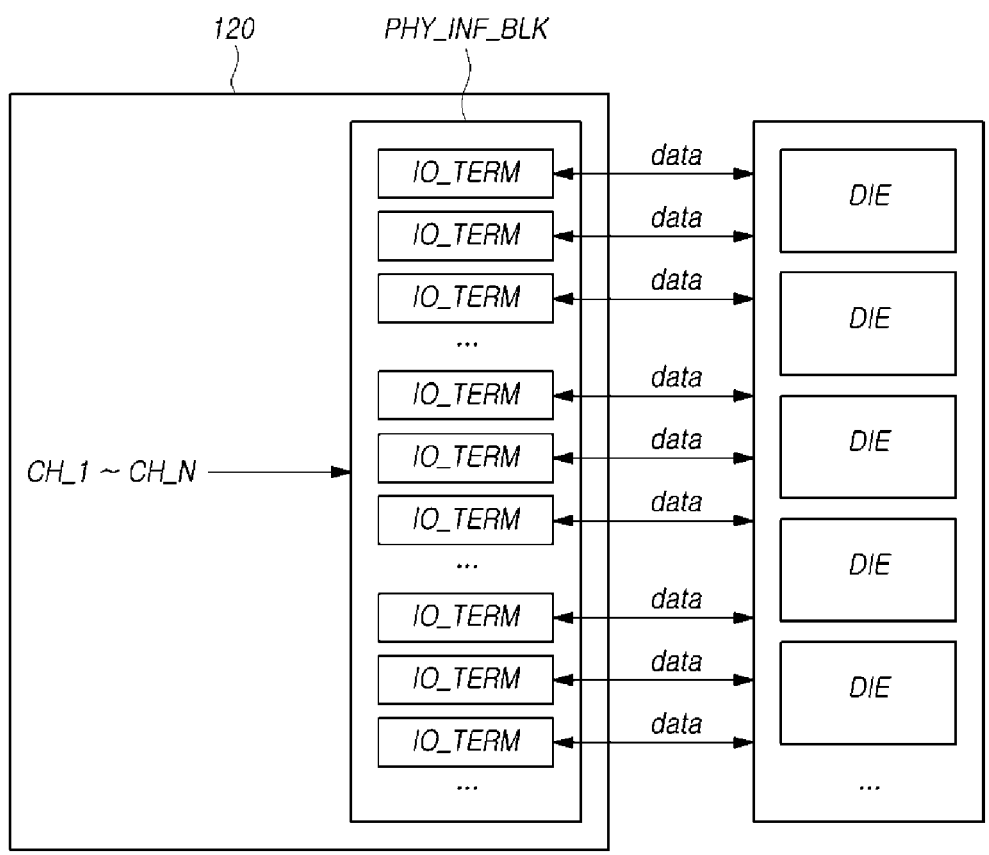
FIG. 5 is a schematic diagram illustrating a structure of a memory system according to an embodiment of the present disclosure.

FIG. 5 is a diagram illustrating a schematic structure of the memory system 100 according to an embodiment of the present disclosure.

Referring to FIG. 5, the memory controller 120 may include a physical interface circuit PHY_INF_BLK. The physical interface circuit PHY_INF_BLK may include a plurality of data input/output terminals IO_TERM. The physical interface circuit PHY_INF_BLK may be referred to as physical interface block.

The data input/output terminals IO_TERM are paths through which data for N channels CH_1 to CH_N is transferred. For example, the data input/output terminal IO_TERM may be a pin.

The channel refers to a path for data communication between the memory controller 120 and a plurality of memory dies DIE included in the memory system 100. The memory controller 120 may transmit and receive data through different channels in parallel.

Data may be transferred to and from the plurality of memory dies DIE included in the memory system 100. The plurality of memory dies DIE may be located on a package included in the memory system 100.

The physical interface circuit PHY_INF_BLK may correspond to the plurality of channels CH_1 to CH_N, where n is a natural number of 2 or more.

In embodiments of the present disclosure, the value of N may be variously determined. For example, the value of N may be determined to be $2^m$ (m is a natural number). This is because the number of channels that can be represented using m bits is $2^m$. That is, N=2, 4, 8, 16 . . . .

Hereinafter, a correspondence relationship between the N channels CH_1 to CH_N and the plurality of data input/output terminals IO_TERM is described by way of example.

Figure 6:
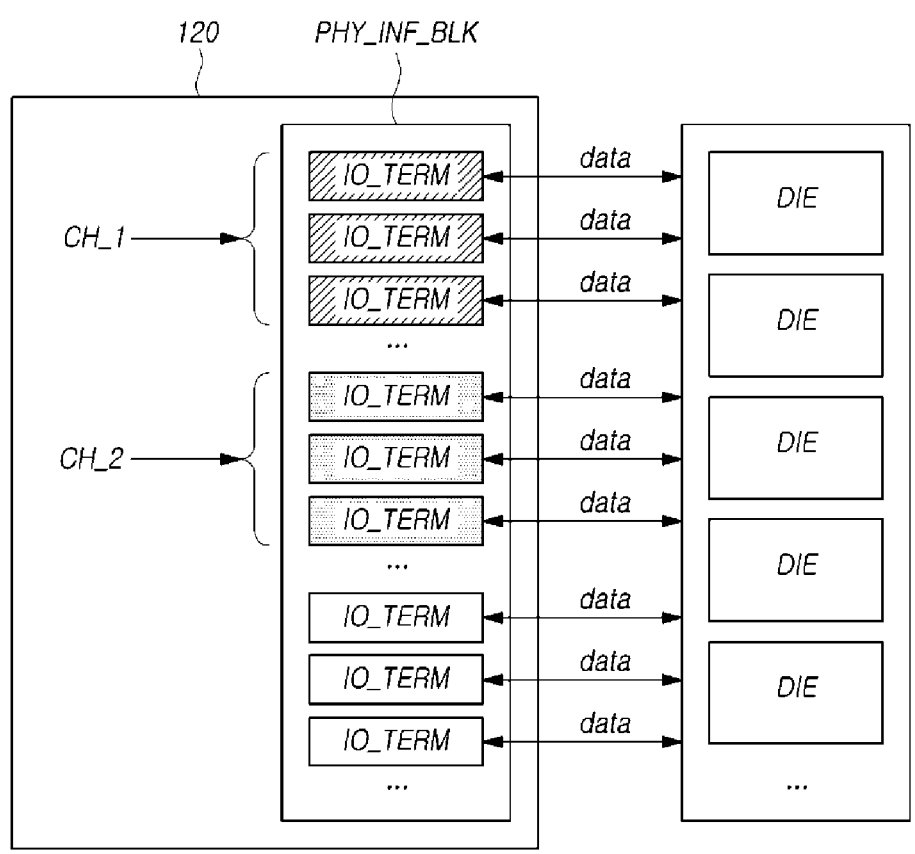
FIG. 6 is a diagram illustrating an example of a correspondence relationship between a channel and a data input/output terminal in a memory system according to an embodiment of the present disclosure.

FIG. 6 is a diagram illustrating an example of a correspondence relationship between a channel and a data input/output terminal in the memory system 100 according to an embodiment of the present disclosure.

Referring to FIG. 6, K data input/output terminals in a first data input/output terminal group IO_TERM_GRP_1, among the plurality of data input/output terminals IO_TERM in the physical interface circuit PHY_INF_BLK, correspond to a first channel CH_1 of the N channels. In this case, that the data input/output terminal corresponds to the first channel CH_1 means that data for the first channel CH_1 can be transferred through the corresponding data input/output terminal.

K data input/output terminals in a second data input/output terminal group IO_TERM_GRP_2, among the plurality of data input/output terminals IO_TERM in the physical interface circuit PHY_INF_BLK, correspond to a second channel CH_2 of the N channels. That the data input/output terminal corresponds to the second channel CH_2 means that data for the second channel CH_2 can be transferred through the corresponding data input/output terminal. CH_2 is different than CH_1.

K is a natural number of 2 or more.

Hereinafter, a case where K=8, that is, a case where eight data input/output terminals correspond to the first channel CH_1 and the second channel CH_2, respectively, is described by way of example.

Figure 7:
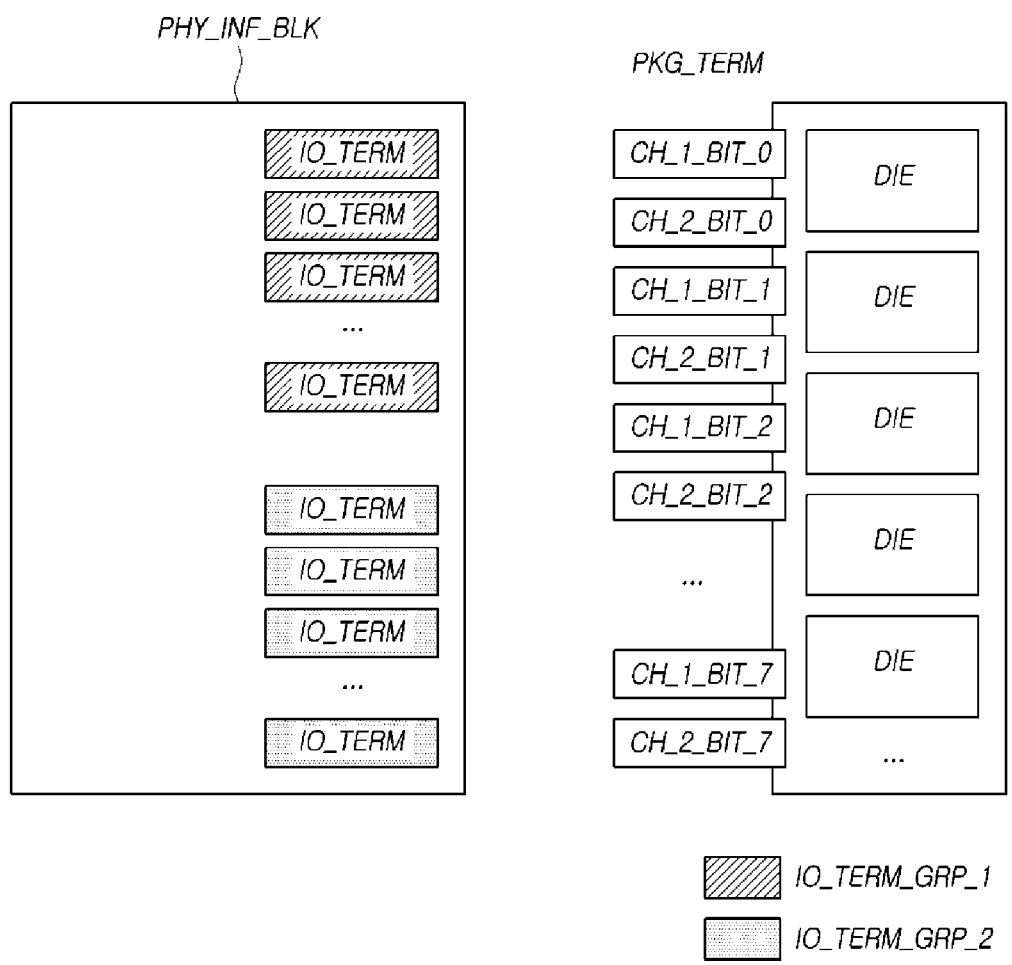
FIG. 7 is a diagram illustrating an example in which a data input/output terminal is arranged in a memory system according to an embodiment of the present disclosure.

FIG. 7 is a diagram illustrating an example in which the data input/output terminal IO_TERM is arranged in the memory system 100 according to an embodiment of the present disclosure.

Referring to FIG. 7, the data input/output terminals in the first data input/output terminal group IO_TERM_GRP_1, among the plurality of data input/output terminals IO_TERM in the physical interface circuit PHY_INF_BLK, may be arranged adjacent to each other. In addition, the data input/output terminals included in the second data input/output terminal group IO_TERM_GRP_2 may be arranged adjacent to each other.

The data input/output terminal IO_TERM may be connected to a package terminal PKG_TERM inside the memory system 100.

The package terminal PKG_TERM is a terminal located on a package included in the memory system 100 and may be connected to one or more of the plurality of memory dies DIE inside the memory system 100. The package terminal PKG_TERM may be a package ball.

The arrangement of the package terminals PKG_TERM inside the memory system 100 may be determined as follows. First, a package terminal CH_1_BIT_0 corresponding to a 0-th bit of the first channel CH_1 and a package terminal CH_2_BIT0 corresponding to a 0-th bit of the second channel CH_2 may be arranged adjacent to each other. A package terminal CH_1_BIT_1 corresponding to a first bit of the first channel CH_1 and a package terminal CH_2_BIT_1 corresponding to a first bit of the second channel CH_2 may be arranged adjacent to each other.

A package terminal CH_1_BIT_2 corresponding to a second bit of the first channel CH_1 and a package terminal CH_2_BIT_2 corresponding to a second bit of the second channel CH_2 may be arranged adjacent to each other. In this pattern, a package terminal CH_1_BIT_7 corresponding to a seventh bit of the first channel CH_1 and a package terminal CH_2_BIT_7 corresponding to a seventh bit of the second channel CH_2 may be arranged adjacent to each other.

In order for data to be transferred through the data input/output terminal IO_TERM, the data input/output terminal IO_TERM and the package terminal PKG_TERM are required to be connected to each other. In order to connect the data input/output terminal IO_TERM to the package terminal PKG_TERM, a pad and a signal line may be disposed between the data input/output terminal IO_TERM and the package terminal PKG_TERM.

Hereinafter, an example of a signal line between the data input/output terminal IO_TERM and the package terminal PKG_TERM for connecting the data input/output terminal IO_TERM and the package terminal PKG_TERM is described.

Figure 8:
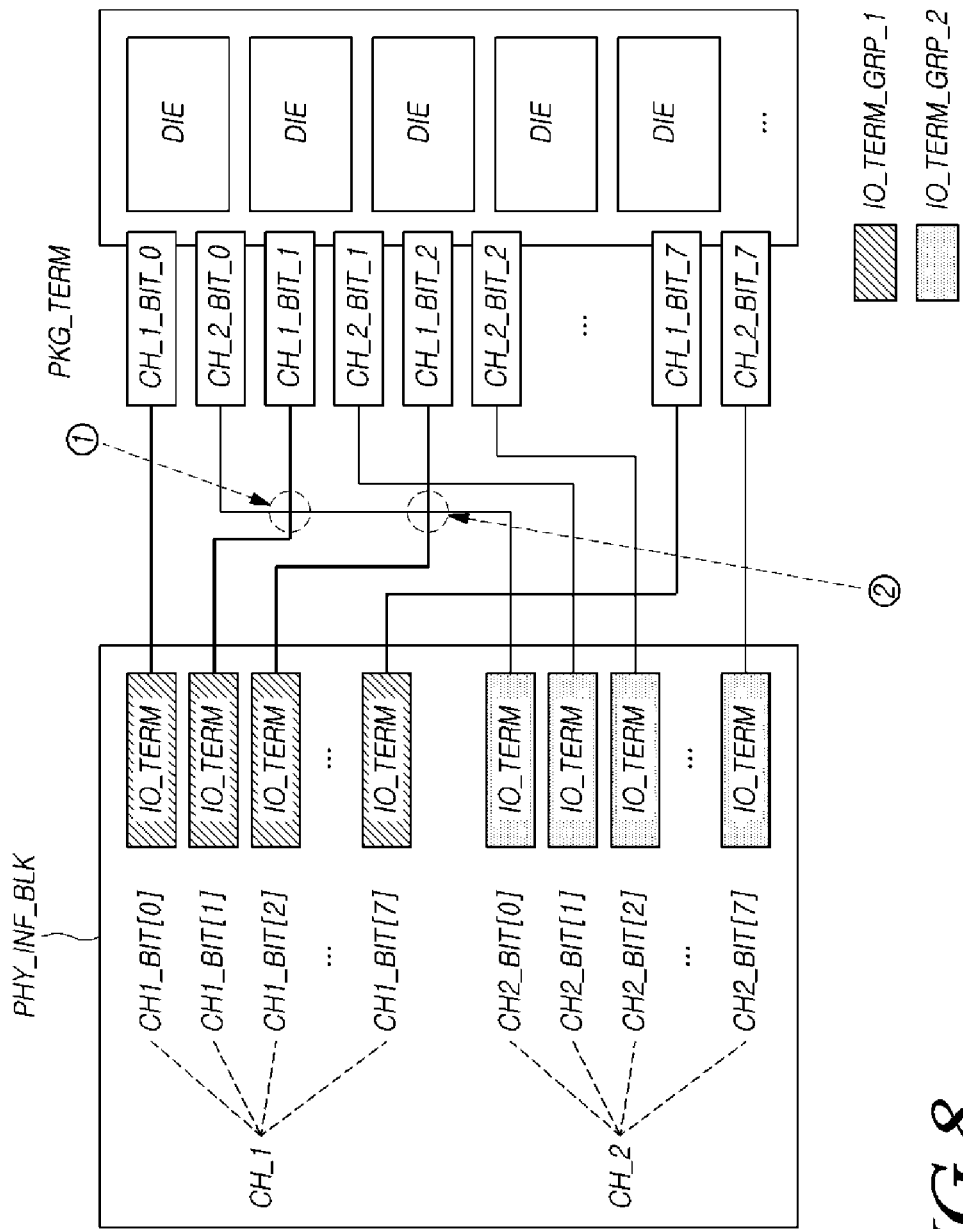
FIG. 8 is a diagram illustrating an example of a configuration of a signal line between a data input/output terminal and a package terminal in FIG. 7.

FIG. 8 is a diagram illustrating an example of a configuration of a signal line between the data input/output terminal IO_TERM and the package terminal PKG_TERM in FIG. 7.

Referring to FIG. 8, there is an intersection point ① between a signal line connecting a data input/output terminal corresponding to a first bit of the first channel CH_1 and a package terminal CH_1_BIT_1 corresponding to the first bit of the first channel CH_1 and a signal line connecting a data input/output terminal corresponding to a 0-th bit of the second channel CH_2 and a package terminal CH_2_BIT_O corresponding to the 0-th bit of the second channel CH_2.

In addition, there is an intersection point ② between a signal line connecting a data input/output terminal corresponding to a second bit of the first channel CH_1 and a package terminal CH_1_BIT_2 corresponding to the second bit of the first channel CH_1 and the signal line connecting the data input/output terminal corresponding to the 0-th bit of the second channel CH_2 and the package terminal CH_2_BIT_O corresponding to the 0-th bit of the second channel CH_2.

In this manner, at a point where different signal lines intersect, skew may occur in a signal transmitted through the signal line or interference may occur between signals transmitted through each signal line. Short may also occur at the point where different signal lines intersect with each other.

Therefore, in order to prevent such a problem, a separate package layer may be added at the intersection point of the signal lines. However, this solution may increase the cost of implementing the memory system 100.

In accordance with an embodiment of the present invention, the data input/output terminals IO_TERM and the package terminals PKG_TERM may be arranged to prevent the signal lines connecting the data input/output terminal IO_TERM and the package terminal PKG_TERM from intersecting with each other.

Figure 9:
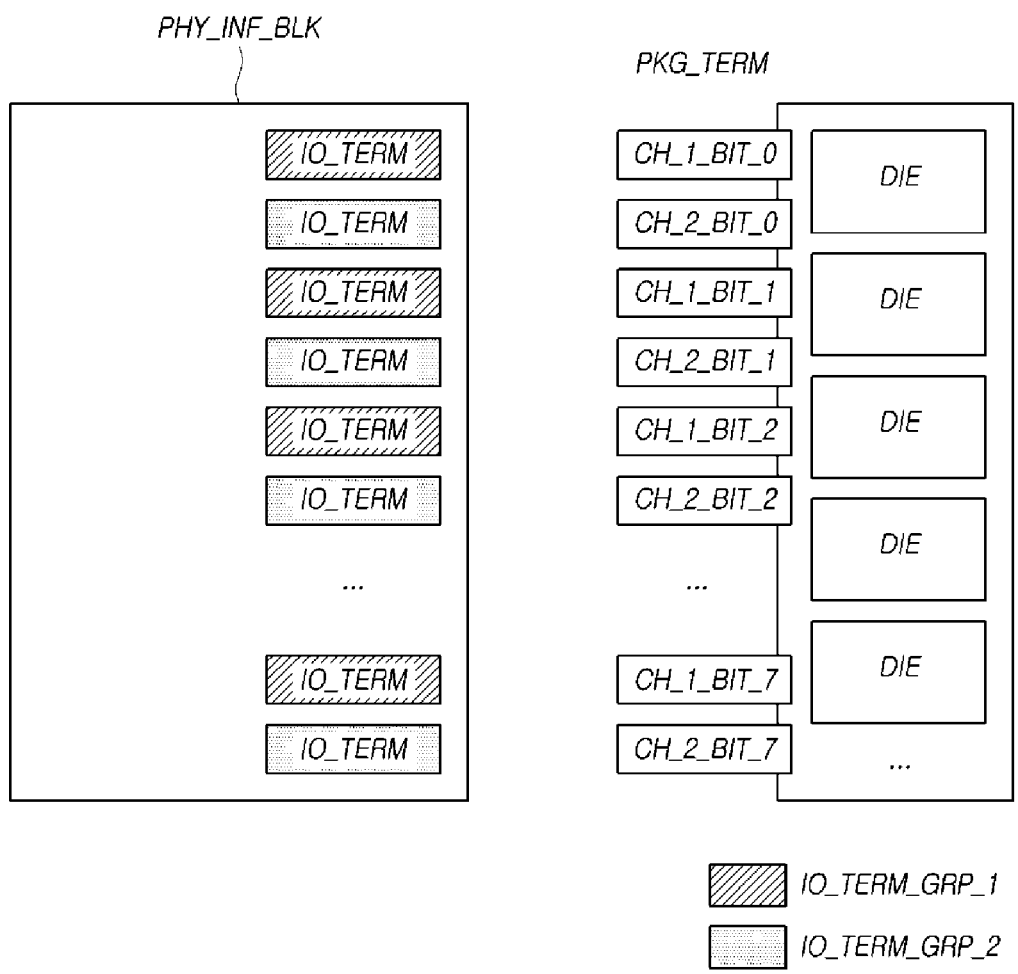
FIG. 9 is a diagram illustrating another example in which a data input/output terminal is arranged in a memory system according to an embodiment of the present disclosure.

FIG. 9 is a diagram illustrating another example in which the data input/output terminal IO_TERM is arranged in the memory system 100 according to an embodiment of the present disclosure.

Among the data input/output terminals IO_TERM in the physical interface circuit PHY_INF_BLK, the data input/output terminals in the first data input/output terminal group IO_TERM_GRP_1 may be arranged adjacent to one or more of the data input/output terminals in the second data input/output terminal group IO_TERM_GRP_2.

Referring to 9, the data input/output terminal in the second data input/output terminal group IO_TERM_GRP_2 may be arranged next to the data input/output terminal in the first data input/output terminal group IO_TERM_GRP_1, and the data input/output terminal in the first data input/output terminal group IO_TERM_GRP_1 may be arranged next to the data input/output terminal in the second data input/output terminal group IO_TERM_GRP_2.

Hereinafter, a configuration of a signal line between the data input/output terminal IO_TERM and the package terminal PKG_TERM when the data input/output terminal IO_TERM is arranged as shown in FIG. 9 is described.

Figure 10:
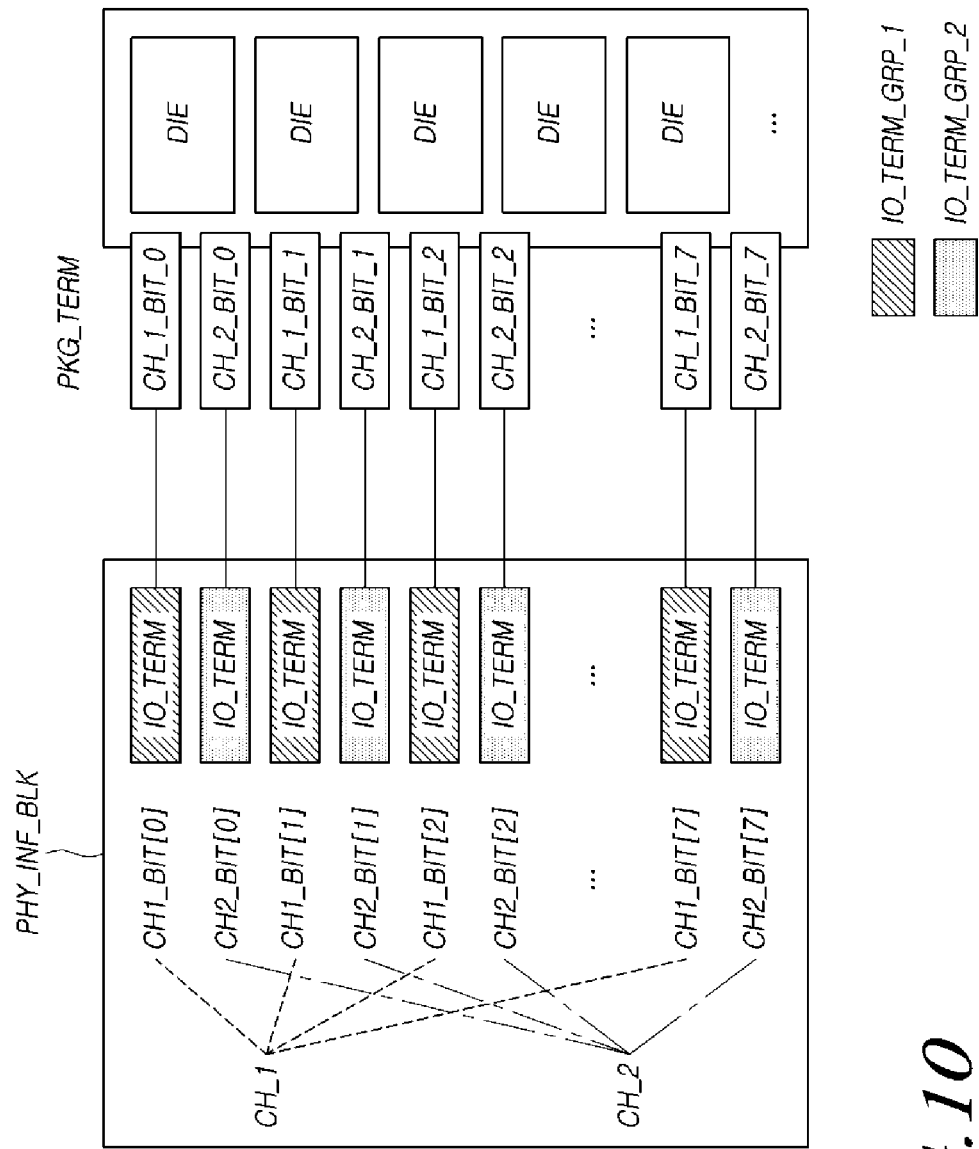
FIG. 10 is a diagram illustrating an example of a configuration of a signal line between a data input/output terminal and a package terminal in FIG. 9.

FIG. 10 is a diagram illustrating an example of a configuration of a signal line between the data input/output terminal IO_TERM and the package terminal in FIG. 9.

Referring to FIG. 10, a data input/output terminal corresponding to data of an I-th bit, among eight data input/output terminals in the first data input/output terminal group IO_TERM_GRP_1, and a data input/output terminal corresponding to data of an I-th bit among eight data input/output terminals in the second data input/output terminal group IO_TERM_GRP_2, may be arranged adjacent to each other. The value of I is a positive integer less than 8 (0 to 7).

First, a data input/output terminal corresponding to data of a 0-th bit, among the data input/output terminals in the second data input/output terminal group IO_TERM_GRP_2, may be arranged after a data input/output terminal corresponding to data of a 0-th bit among the data input/output terminals in the first data input/output terminal group IO_TERM_GRP_1.

Next, a data input/output terminal corresponding to data of a first bit, among the data input/output terminals in the second data input/output terminal group IO_TERM_GRP_2, may be arranged after a data input/output terminal corresponding to data of a first bit, among the data input/output terminals in the first data input/output terminal group IO_TERM_GRP_1.

In this pattern, a data input/output terminal corresponding to data of a seventh bit, among the data input/output terminals in the second data input/output terminal group IO_TERM_GRP_2, may be arranged after a data input/output terminal corresponding to data of a seventh bit, among the data input/output terminals in the first data input/output terminal group IO_TERM_GRP_1.

When the data input/output terminal IO_TERM and the package terminal PKG_TERM are arranged as described above, there is no point where signal lines between the data input/output terminal IO_TERM and the package terminal PKG_TERM intersect with each other. Unlike FIG. 8, this is because a pattern of the order in which the data input/output terminals IO_TERM are arranged inside the physical interface circuit PHY_INF_BLK and a pattern of the order in which the package terminals PKG_TERM are arranged according to channels and bits coincide with each other. That is, the signal lines between the data input/output terminals IO_TERM and the package terminals PKG_TERM may be configured not to cross one another.

Thus, it is possible to prevent a situation in which skew of a signal transmitted through each signal line or interference between different signals occurs. Therefore, it is not necessary to add a separate package layer to prevent a problem caused by different signal lines intersecting with each other as shown in FIG. 8. As a result, the cost of implementing the memory system 100 may be reduced.

Hereinafter, an example in which data is transmitted to the memory die DIE through each channel when a signal line between the data input/output terminal IO_TERM and the package terminal PKG_TERM is arranged as shown in FIG. 10 is described.

The memory controller 120 of the memory system 100 may transmit or receive data in units of K bits of a data segment through K data input/output terminals in the first data input/output terminal group IO_TERM_GRP_1. The memory controller 120 may transmit or receive data in units of K bits of data segment through K data input/output terminals in the second data input/output terminal group IO_TERM_GRP_2.

Figure 11:
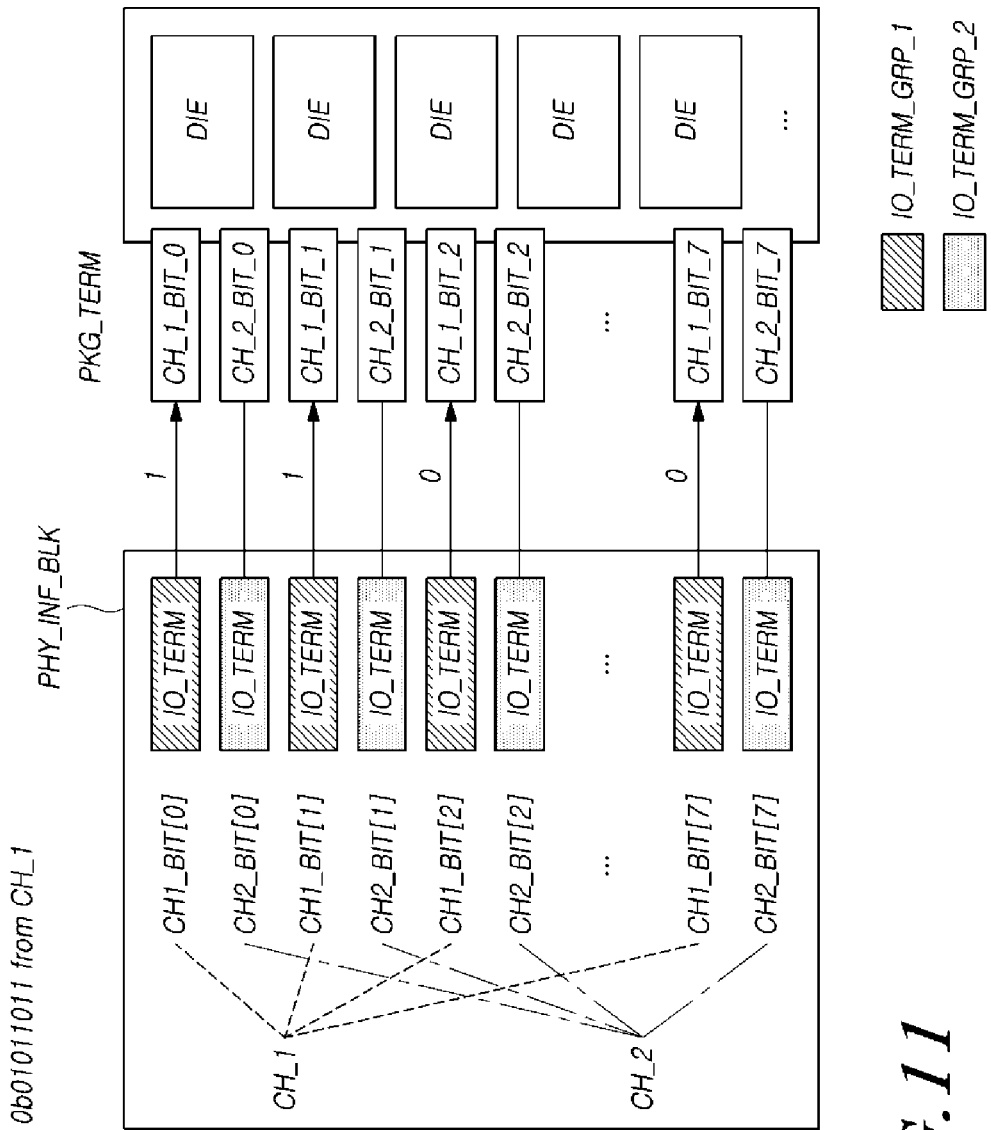
FIG. 11 is a diagram illustrating an example in which data is transmitted to a memory die through a first channel, such as that in FIG. 10.

FIG. 11 is a diagram illustrating an example in which data is transmitted to the memory die DIE through the first channel CH_1 in FIG. 10.

In FIG. 11, it is assumed that an 8-bit data segment of 0b01011011 is transmitted to the memory die DIE through the first channel CH_1.

In this case, through a data input/output terminal corresponding to a 0-th bit of the first channel CH_1 in which a bit value corresponding to a 0-th bit of 0b01011011 is 1, the 8-bit data segment 0b01011011 may be transmitted to a package terminal CH_1_BIT_0 corresponding to the 0-th bit of the first channel CH_1.

At the same time, through a data input/output terminal corresponding to a first bit of the first channel CH_1 in which a bit value corresponding to a first bit of 0b01011011 is 1, the 8-bit data segment 0b01011011 may be transmitted to a package terminal CH_1_BIT_1 corresponding to the first bit of the first channel CH_1.

At the same time, through a data input/output terminal corresponding to a second bit of the first channel CH_1 in which a bit value corresponding to a second bit of 0b01011011 is 0, the 8-bit data segment 0b01011011 may be transmitted to a package terminal CH_1_BIT_2 corresponding to the second bit of the first channel CH_1.

In the above-described pattern, through a data input/output terminal corresponding to a seventh bit of the first channel CH_1 in which a bit value corresponding to a seventh bit of 0b01011011 is 0, the 8-bit data segment 0b01011011 may be transmitted to a package terminal CH_1_BIT_7 corresponding to the seventh bit of the first channel CH_1.

In this manner, each bit value of the data segment transmitted to the package terminal may be transmitted to any one of the plurality of memory dies DIE.

Figure 12:
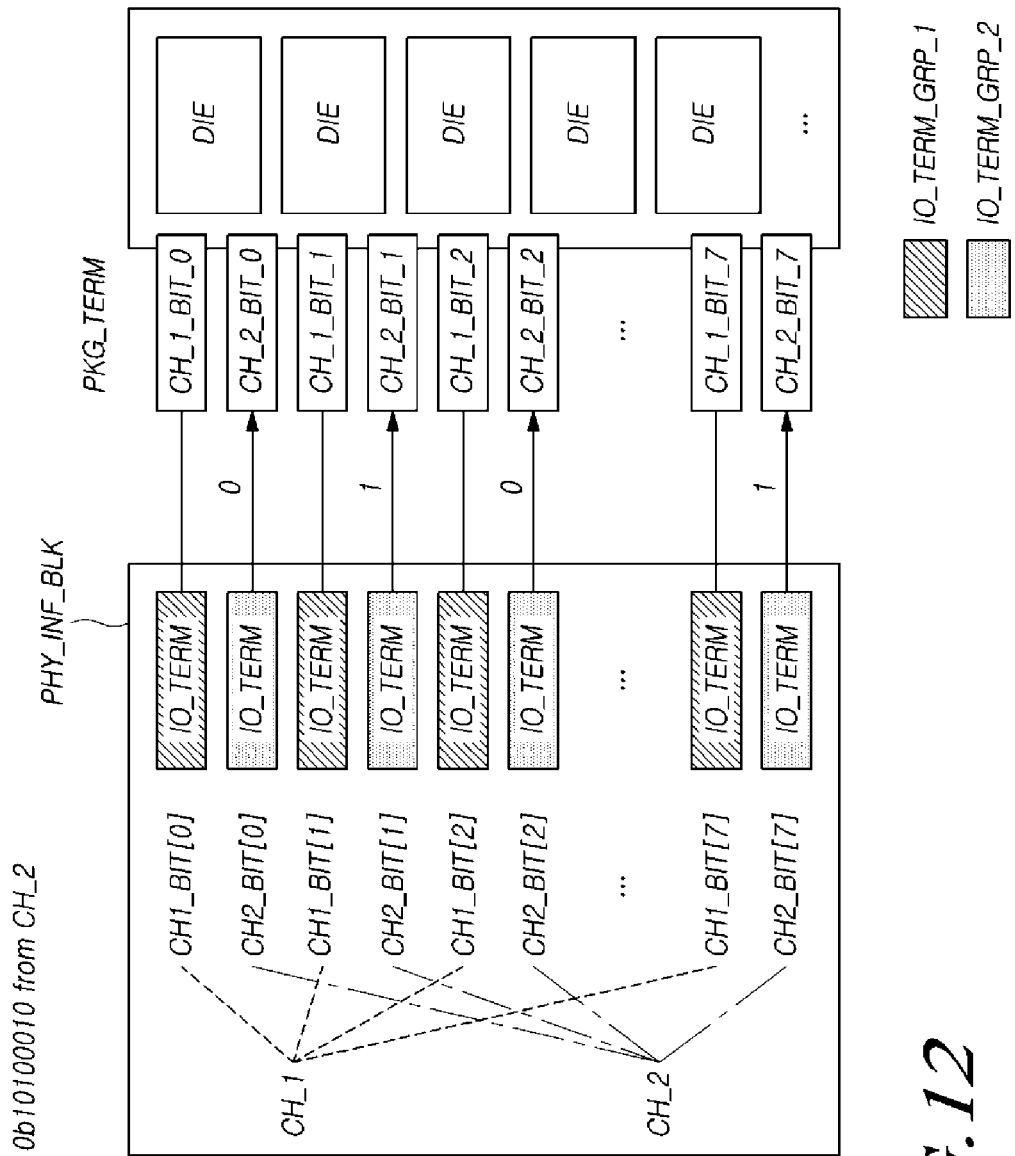
FIG. 12 is a diagram illustrating an example in which data is transmitted to a memory die through a second channel, such as that in FIG. 10.

FIG. 12 is a diagram illustrating an example in which data is transmitted to the memory die DIE through the second channel CH_2 in FIG. 10.

In FIG. 12, it is assumed that an 8-bit data segment of 0b10100010 is transmitted to the memory die DIE through the second channel CH_2.

In this case, through a data input/output terminal corresponding to a 0-th bit of the second channel CH_2 in which a bit value corresponding to a 0-th bit of 0b10100010 is 0, the 8-bit data segment 0b10100010 may be transmitted to a package terminal CH_2_BIT_0 corresponding to the 0-th bit of the second channel CH_2.

At the same time, through a data input/output terminal corresponding to a first bit of the second channel CH_2 in which a bit value corresponding to a first bit of 0b10100010 is 1, the 8-bit data segment 0b10100010 may be transmitted to a package terminal CH_2_BIT_1 corresponding to the first bit of the second channel CH_2.

At the same time, through a data input/output terminal corresponding to a second bit of the second channel CH_2 in which a bit value corresponding to a second bit of 0b10100010 is 0, the 8-bit data segment 0b10100010 may be transmitted to a package terminal CH_2_BIT_2 corresponding to the second bit of the second channel CH_2.

In the above-described pattern, through a data input/output terminal corresponding to a seventh bit of the second channel CH_2 in which a bit value corresponding to a seventh bit of 0b10100010 is 1, the 8-bit data segment 0b10100010 may be transmitted to a package terminal CH_2_BIT_7 corresponding to the seventh bit of the second channel CH_2.

In this manner, each bit value of the data segment transmitted to the package terminal may be transmitted to any one of the plurality of memory dies DIE.

Figure 13:
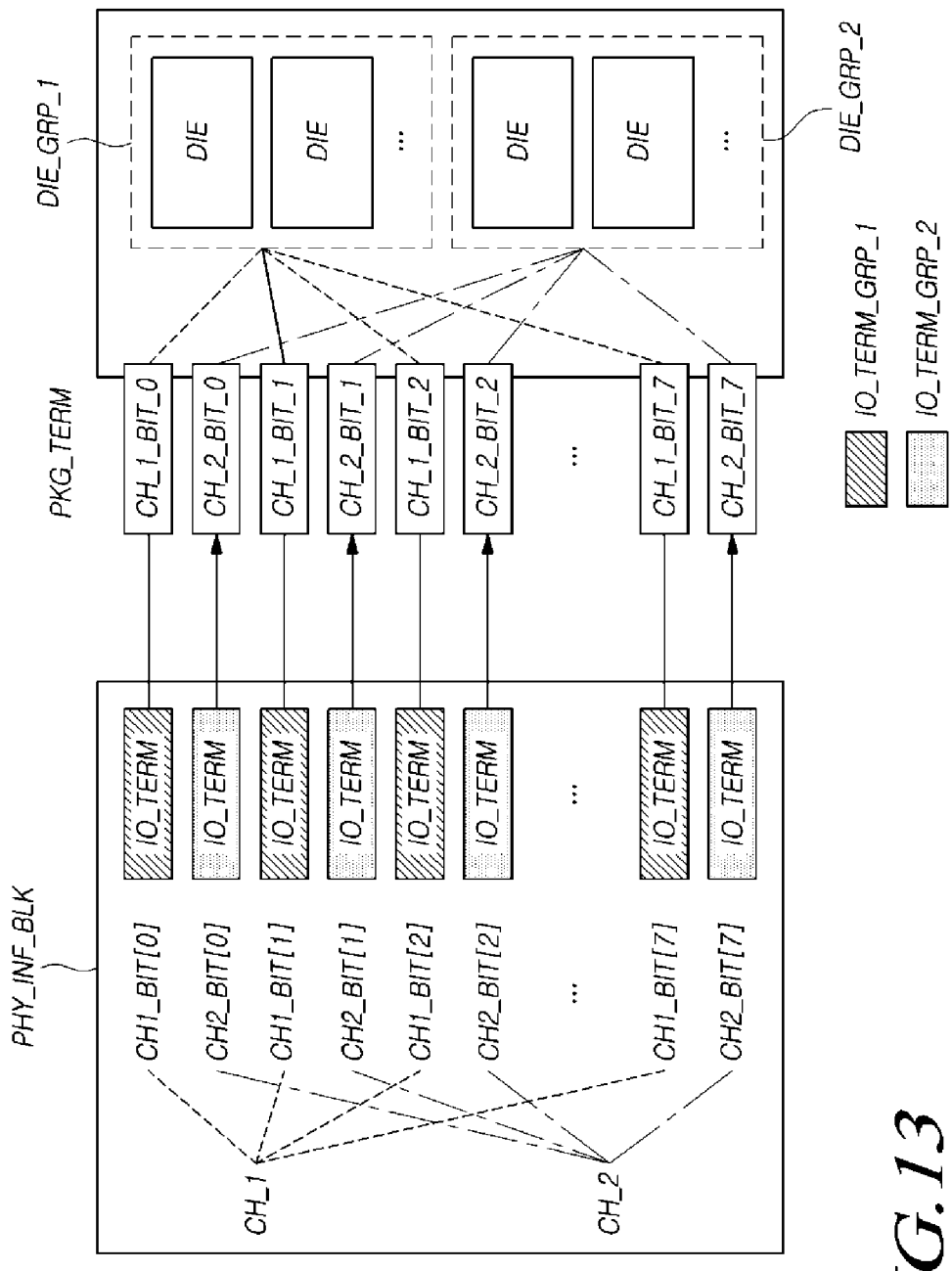
FIG. 13 is a diagram illustrating an example of each of a first memory die group and a second memory die group.

FIG. 13 is a diagram illustrating an example of each of a first memory die group DIE_GRP_1 and a second memory die group DIE_GRP_2 in FIG. 10.

Referring to FIG. 13, a data input/output terminal in the first data input/output terminal group IO_TERM_GRP_1 may be connected to a memory die in a first memory die group DIE_GRP_1 among the plurality of memory dies DIE in the memory system 100.

In FIG. 13, the data input/output terminal corresponding to a 0-th bit among the data input/output terminals in the first data input/output terminal group IO_TERM_GRP_1 may be connected to a memory die in the first memory die group DIE_GRP_1 through a package terminal CH_1_BIT_0 corresponding to the 0-th bit of the first channel CH_1. In this pattern, the data input/output terminal corresponding to an I-th bit (I is a natural number of 7 or less) among the data input/output terminals in the first data input/output terminal group IO_TERM_GRP_1 may be connected to a memory die included in the first memory die group DIE_GRP_1 through a package terminal corresponding to the I-th bit of the first channel CH_1.

The data input/output terminal in the second data input/output terminal group IO_TERM_GRP_2 may be connected to the memory die in the second memory die group DIE_GRP_2 among the plurality of memory dies DIE in the memory system 100.

In FIG. 13, the data input/output terminal corresponding to a 0-th bit of the data input/output terminals in the second data input/output terminal group IO_TERM_GRP_2 may be connected to a memory die in the second memory die group DIE_GRP_2 through the package terminal CH_2_BIT_0 corresponding to a 0-th bit of the second channel CH_2. In this pattern, the data input/output terminal corresponding to an I-th bit (I is a natural number of 7 or less) among the data input/output terminals in the second data input/output terminal group IO_TERM_GRP_2 may be connected to a memory die in the second memory die group DIE_GRP_2 through a package terminal corresponding to an I-th bit of the second channel CH_2.

The above-described operation of the memory controller 120 may be controlled by the control circuit 123, and the processor 124 may be performed in a manner in which various operations of the memory controller 120 execute (drive) programmed firmware.

Figure 14:
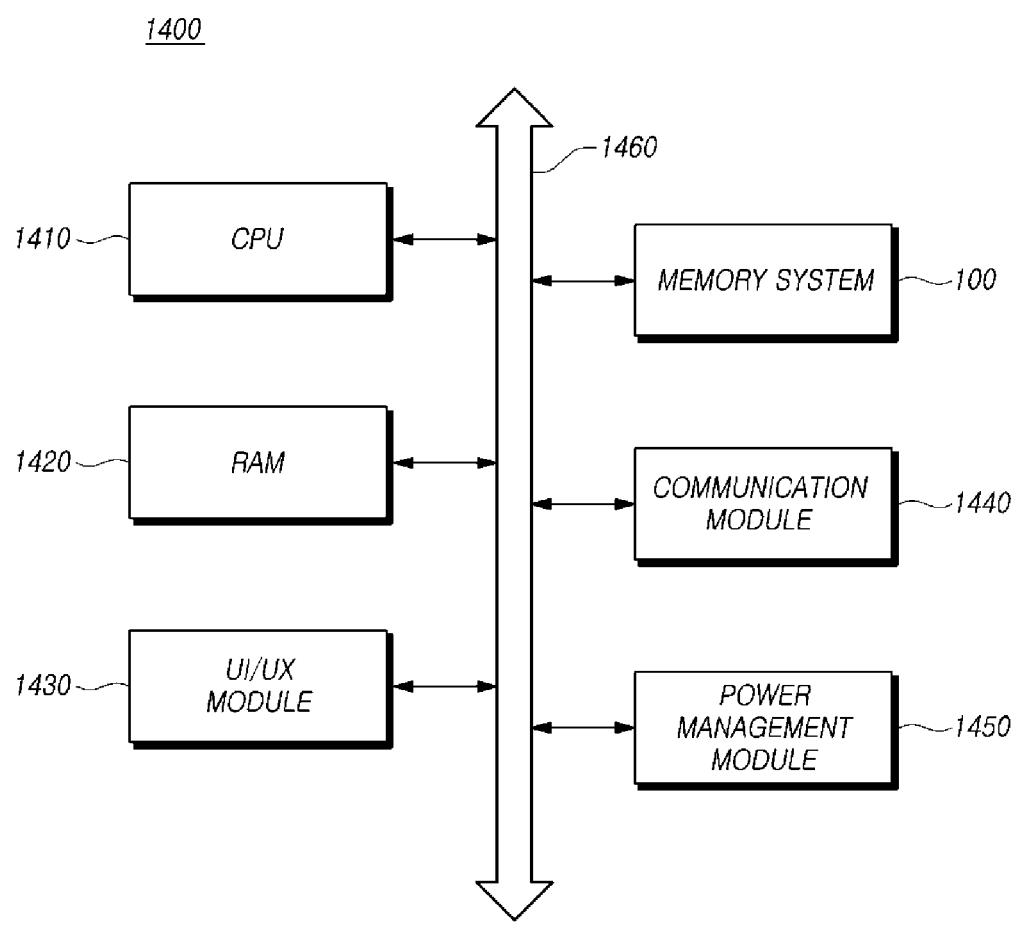
FIG. 14 is a diagram illustrating a configuration of a computing system according to an embodiment of the present disclosure.

FIG. 14 is a diagram illustrating the configuration of a computing system 1400 according to an embodiment of the present disclosure.

Referring to FIG. 14, the computing system 1400 may include: a memory system 100 electrically connected to a system bus 1460; a CPU 1410 configured to control the overall operation of the computing system 1400; a RAM 1420 configured to store data and information related to operations of the computing system 1400; a user interface/user experience (UI/UX) module 1430 configured to provide the user with a user environment; a communication module 1440 configured to communicate with an external device in a wired and/or wireless type; and a power management module 1450 configured to manage power used by the computing system 1400.

The computing system 1400 may be a personal computer (PC) or may include a mobile terminal such as a smartphone, a tablet or any of various other electronic devices.

The computing system 1400 may further include a battery for supplying an operating voltage, and may further include an application chipset, a graphic-related module, a camera image processor (CIS), and a DRAM. The computer system 1400 may include other elements as those skilled in the art understand.

The memory system 100 may be a device configured to store data in a magnetic disk such as a hard disk drive (HDD), or a device configured to store data in a nonvolatile memory such as a solid state drive (SSD), a universal flash storage device, or an embedded MMC (eMMC) device. The non-volatile memory may include a read only memory (ROM), a programmable ROM (PROM), an electrically programmable ROM (EPROM), an electrically erasable and programmable ROM (EEPROM), a flash memory, a phase-change RAM (PRAM), a magnetic RAM (MRAM), a resistive RAM (RRAM), a ferroelectric RAM (FRAM), and the like. In addition, the memory system 100 may be implemented as any of various storage devices of various types, which may be mounted within various electronic devices.

According to embodiments of the present disclosure described above, operation delay time of the memory system may be minimized. In addition, according to an embodiment of the present disclosure, overhead occurring in the process of calling a specific function may be minimized. Although various embodiments of the present disclosure have been illustrated and described, those skilled in the art will appreciate that various modifications, additions and substitutions are possible, without departing from the scope and spirit of the invention as set forth in the accompanying claims. That is, the present invention encompasses all modifications and variations of any of the disclosed embodiments that fall within the scope of the claims.

What is claimed is:

1. A memory system comprising:
a plurality of memory dies; and
a memory controller configured to control the plurality of memory dies,
wherein:
the memory controller comprises a physical interface circuit including a plurality of data input/output terminals which are paths through which data for N channels is input/output,
K data input/output terminals in a first data input/output terminal group among the plurality of data input/output terminals correspond to a first channel among the N channels,
K data input/output terminals in a second data input/output terminal group among the plurality of data input/output terminals correspond to a second channel different from the first channel among the N channels,
the memory controller transmits and receives data through the first channel and the second channel in parallel, one of the K data input/output terminals in the first data input/output terminal group is arranged adjacent to one or more of the K data input/output terminals in the second data input/output terminal group,
each data input/output terminal is connected to one of a plurality of package terminals connected to one or more of the plurality of memory dies,
the K data input/output terminals and the plurality of package terminals are arranged to prevent signal lines from intersecting with each other,
each of the signal lines connects one of the K data input/output terminals and one of the plurality of package terminals,
a first package terminal among the package terminals corresponding to a L-th bit of the first channel is arranged adjacent to a second package terminal among the package terminals corresponding to a L-th bit of the second channel,
the memory controller transmits data from one of the K data input/output terminals in the first data input/output terminal group to the first package terminal through the first channel and transmits another data from one of the K data input/output terminals in the second data input/output terminal group to the second package terminal through the second channel simultaneously while the memory controller transmits data through the first channel,
L is an integer greater than or equal to 0, and
N and K are each a natural number of 2 or more.

2. The memory system of claim 1, wherein a data input/output terminal corresponding to data of an I-th bit among the K data input/output terminals in the first data input/output terminal group is arranged adjacent to a data input/output terminal corresponding to data of an I-th bit among the K data input/output terminals in the second data input/output terminal group.

3. The memory system of claim 2, wherein the memory controller exchanges data in units of K-bit data segments through the K data input/output terminals in the first data input/output terminal group, and exchanges data in units of K-bit data segments through the K data input/output terminals in the second data input/output terminal group.

4. The memory system of claim 3, wherein:
the data input/output terminal in the first data input/output terminal group is connected to a memory die in a first memory die group among the plurality of memory dies, and
the data input/output terminal in the second data input/output terminal group is connected to a memory die in a second memory die group among the plurality of memory dies.

5. A memory controller comprising:
a memory interface configured to communicate with a plurality of memory dies; and
a control circuit configured to control the plurality of memory dies,
wherein:
the control circuit controls a physical interface circuit including a plurality of data input/output terminals which are paths through which data for N channels is input/output, K data input/output terminals in a first data input/output terminal group among the plurality of data input/output terminals correspond to a first channel among the N channels, K data input/output terminals in a second data input/output terminal group among the plurality of data input/output terminals correspond to a second channel different from the first channel among the N channels, the control circuit transmits and receives data through the first channel and the second channel in parallel, the data input/output terminal in the first data input/output terminal group is arranged adjacent to one or more of the data input/output terminals in the second data input/output terminal group, each data input/output terminal is connected to one of a plurality of package terminals connected to one or more of the plurality of memory dies, the K data input/output terminals and the plurality of package terminals are arranged to prevent signal lines from intersecting with each other, each of the signal lines connects one of the K data input/output terminals and one of the plurality of package terminals, a first package terminal among the package terminals corresponding to a L-th bit of the first channel is arranged adjacent to a second package terminal among the package terminals corresponding to a L-th bit of the second channel, the control circuit transmits data from one of the K data input/output terminals in the first data input/output terminal group to the first package terminal through the first channel and transmits another data from one of the K data input/output terminals in the second data input/output terminal group to the second package terminal through the second channel simultaneously while the memory controller transmits data through the first channel, L is an integer greater than or equal to 0, and N and K are each a natural number of 2 or more.

6. The memory controller of claim 5, wherein a data input/output terminal corresponding to data of an I-th bit among the data input/output terminals in the first data input/output terminal group is arranged adjacent to a data input/output terminal corresponding to data of an I-th bit among the data input/output terminals in the second data input/output terminal group.

7. The memory controller of claim 6, wherein the control circuit transmits or receives data in units of K-bit data segments through the K data input/output terminals in the first data input/output terminal group, and transmits or receives data in units of K-bit data segments through the K data input/output terminals in the second data input/output terminal group.

8. The memory controller of claim 7, wherein the data input/output terminal in the first data input/output terminal group is connected to a memory die in a first memory die group among the plurality of memory dies, and the data input/output terminal in the second data input/output terminal group is connected to a memory die in a second memory die group among the plurality of memory dies.

9. A system comprising:

master and slave circuits each including N groups each having K terminals, wherein the master and slave circuits communicate with each other through the terminals transferring signals of N channels each having a bandwidth of K bits, wherein the master and slave circuits transmit and receive data through the N channels in parallel, wherein the N groups respectively correspond to the N channels, wherein the K terminals respectively correspond to the K bits, wherein the K terminals within each of the N groups are sequentially disposed at each of the master and slave circuits, and wherein the K terminals which have same sequence within the respective N groups are alternately disposed at each of the master and slave circuits, the master circuit transmits data from a first terminal of the K terminals in a first group of the N groups in the master circuit to a terminal in the slave circuit which corresponds to the first terminal through a first channel of the N channels, and transmits another data from a second terminal of the K terminals in a second group of the N groups in the master circuit to another terminal in the slave circuit which corresponds to the second terminal through a second channel of the N channels simultaneously while the memory controller transmits data through the first channel.

* * * * *